Nov. 3, 1970 B. W. BOLAND 3,537,921

SELECTIVE HYDROFLUORIC ACID ETCHING AND SUBSEQUENT PROCESSING

Filed Feb. 28, 1967

INVENTOR.
Bernard W. Boland

BY Mueller, Aichele & Rauner

ATTYS.

United States Patent Office
3,537,921
Patented Nov. 3, 1970

3,537,921

SELECTIVE HYDROFLUORIC ACID ETCHING AND SUBSEQUENT PROCESSING

Bernard W. Boland, Scottsdale, Ariz., assignor to Motorola, Inc., Franklin Park, Ill., a corporation of Illinois Filed Feb. 28, 1967, Ser. No. 624,643
Int. Cl. H01l 7/50
U.S. Cl. 148—187 5 Claims

ABSTRACT OF THE DISCLOSURE

A process for selectively etching silicon nitride, chromium, ultra thin silicon dioxide, etc. layers using a thin layer of silicon as a mask against hydrofluoric acid (HF) etchants. Then long diffusions, using indium, gallium, etc. are performed through a selectively etched silicon nitride mask into an underlying semiconductor without mask reprocessing cycles.

BACKGROUND OF THE INVENTION

This invention relates to methods of selectively etching highly resistant materials with hydrofluoric acid (HF) etchants and to the usage of HF etched masks in gallium and indium long diffusions.

In semiconductor fabrication it is desirable that the mask used to form various semiconductor structures be also used to passivate a semiconductor junction surface. To date it is quite common that silicon dioxide (glass) be used as a passivation layer. It has been found, however, that silicon dioxide is not impervious to radiation or to certain desirable impurities. In this regard, radiation and impurity diffusion resistant silicon nitride, $Si_3N_4$, may be used as a passivation layer. Using silicon nitride in semiconductor fabrication techniques presents several difficulties. For example, photo-resists, such as KMER have been tried as masks in selectively etching silicon nitride. The only known etchant that will attack silicon nitride is concentrated, hot hydrofluoric acid. Concentrated hydrofluoric acid reacts with the common photoresists, including KMER. It tends in a short time to soften and loosen the photoresist causing it to lose its effectiveness. Therefore, during such an HF etching process after the photoresist has become soft, the material being processed must be removed from the etching chamber and baked to reharden the photoresist. Also, it may require reapplication of photoresist to ensure sufficient masking against the hydrofluoric acid. The same photoresist problems are found in the etching of chromium and other materials that are also difficult to etch except in solutions which attack the resist itself.

Extremely thin layers of silicon dioxide, i.e., about 1000 Angstrom units thick are also difficult to accurately etch.

Problems in maintaining masks against diffusions are found in gallium and indium diffusions. Gallium and indium diffusions are charactetrized in that they are relatively long, i.e., extend from 30 to 50 or more hours as compared to a few hours for other types of impurity diffusion operations. When silicon dioxide is used to mask against gallium or indium diffusions there is a tendency for the impurity such as gallium or indium to react with the $SiO_2$. The $SiO_2$ films soften and require reprocessing to ensure their integrity. In one diffusion using a silicon dioxide mask, the mask material had to be reprocessed 10 to 30 times in one diffusion cycle. Such reprocessing requires the removal of the material being processed from the diffusion chamber to a second apparatus. This operation increases the chances of impurities reaching the material being processed and of changing the resultant device characteristics.

SUMMARY OF THE INVENTION

It is an object of this invention to provide a facile method of selectively etching with concentrated, hot hydrofluoric acid etchants.

It is another object of this invention to provide a selectively etched silicon nitride mask and passivation layer for semiconductor devices which is insensitive to oxygen atmospheres.

It is another object of this invention to provide improved methods for masking against gallium and indium diffusions and resultant semiconductor structures formed with such diffusions.

According to this invention a silicon nitride layer, such as $Si_3N_4$, is deposited on a semiconductor body such as through the reaction of $NH_4$, $SiH_4$ and $H_2$. Prior to etching the silicon nitride film, an extremely thin (i.e., 200 Angstroms) layer of polycrystalline silicon is vapor deposited over the surface of the silicon nitride layer. Such deposition may be made from silane at 900° C. and at a rate of 0.1 microns per minute to a thickness of 200 Angstroms, for example. The thin polycrystalline layer silicon is then masked with a common photoresist. Then a quick etch step using HF-nitric acid mixtures is performed to selectively etch a pattern into the silicon layer exposing selected portions of the silicon nitride layer. Concentrated hydrofluoric acid is then introduced to etch the exposed silicon nitride. Silicon is non-reactive with hydrofluoric acid and therefore forms a good mask. After the silicon nitride has been etched through to the semiconductor body the etching automatically stops. The substrates are further processed as desired.

For example, the material being processed may be subjected to a gallium or indium diffusion in an oxygen atmosphere. Oxygen attacks silicon nitride, however, the silicon nitride layer is protected by the previously deposited silicon layer. Gallium or indium may diffuse into the silicon coating with no adverse affects on the resultant semiconductor product. Using the above described technique it is unnecessary to remove the materials from the processing apparatus for revitalizing a mask during a long diffusion operation. The silicon layer also serves to protect the nitride layer in oxygen atmospheres.

Hydrofluoric acid etching is also useful for the etching of chromium and thin-layered silicon dioxide films. The method described above is useful in the selective etching of such materials.

BRIEF DESCRIPTION OF THE DRAWING

FIG. 2 is a series of schematic cross-sectional views aligned with the FIG. 1 steps to illustrate a structure which may be expected when practicing the method of this invention wherein:

FIG. 2–2 shows structure after completion of step numbered 2;

FIG. 2–3 shows structure after completion of step numbered 3;

FIG. 2–4 shows structure after completion of step numbered 4;

FIG. 2–5 shows structure after completion of step numbered 5;

FIG. 2–6 shows structure after completion of step numbered 6;

FIG. 2–7 shows structure after completion of step numbered 7.

FIG. 3 shows an additional semiconductor structure made according to the methods of this invention.

DESCRIPTION OF THE ILLUSTRATIVE EMBODIMENTS

Figure 1:
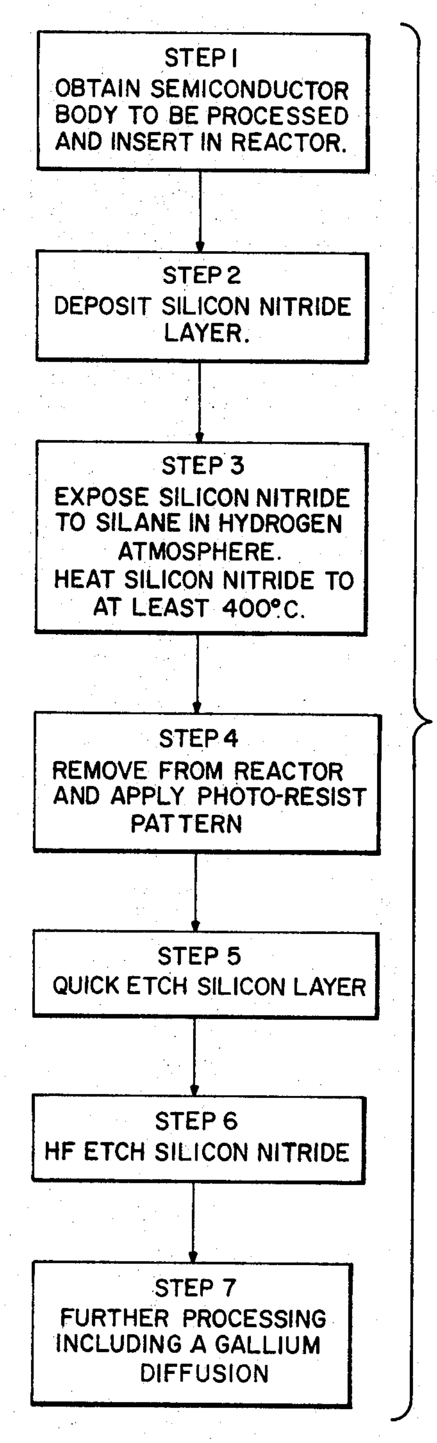
FIG. 1 is a flow chart illustrating a method embodying the present invention.
Figure 2:
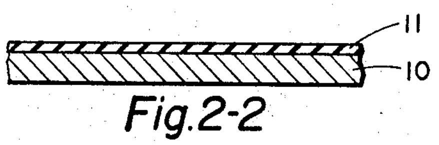

Referring to FIG. 1 there are shown a series of process steps illustrating one embodiment of the present invention and in FIG. 2 there are shown a plurality of structures formed by the FIG. 1 illustrated process. The structure illustrations being aligned with steps in the process which produce them are aligned. In step 1 of the process, a semiconductor body 10, silicon or germanium, is obtained and inserted in a suitable reactor apparatus (not shown) of known design and operation. In step 2 a layer 11 of silicon nitride is deposited on wafer 10 to form a passivation coating thereon.

In step 3 the nitride coated wafer is exposed in a non-reactive atmosphere, such as hydrogen, to silane to form a layer 12 of pure silicon over nitride layer 11. The polycrystalline silicon film is formed for example at a rate of 1000 Angstrom units per minute, although one can deposit such silicon at a slower rate, until a thickness of about 200 Angstrom units are obtained. It is desired that the polycrystalline silicon film thickness be kept ultra-thin. In forming the polycrystalline silicon from silane ($SiH_4$) gas the nitride coated silicon structure wafer 10 has an elevated temperature, for example 400° C. Any raised temperature in this range from 400° C. to 1400° C. is satisfactory. One must be careful not to disturb a pre-diffused impurity profile of any element in the article being processed.

While there are many forms of silicon nitride such as SiN, $Si_2N$, and $Si_3N$, $SiN_2$, $Si_2N_5$, such compounds usually revert to the most stable nitride form—$Si_3N_4$. Of the various forms of silicon nitride, the $Si_3N_4$ form is the most difficult to etch. In forming nitride layer 11, one of the more unstable forms, such as listed above may be used; then after processing heat may be applied to the article for converting such nitride to the more stable form $Si_3N_4$.

In step 4 the article is removed from the reactor and photoresist layer 13 is formed in known manner over polycrystalline silicon layer 12. Layer 13 includes a plurality of apertures 14 for exposing portions of the polycrystalline silicon film 12 for selective etching. In step 6, polycrystalline silicon layer 12 is quick-etched. A "quick etch" is performed for example when the article to be etched is only momentarily immersed in an etchant bath. Because the polycrystalline silicon layer 12 is ultra-thin, i.e., 200 Angstrom units, such momentary immersion is sufficient to etch completely through layer 12 to form aperture 14A therein exposing portion 15 of silicon nitride layer 11. The article is now ready to have the silicon nitride layer 11 selectively etched.

The facile method of selectively etching with concentrated hydrofluoric acid is shown in step 6 wherein the article has been inserted in a suitable etching apparatus for exposing the article face 16 to a hydrofluoric acid etchant referred to herein as HF. The HF etches through silicon nitride layer 11 to form aperture 14B therein. Photoresist layer 13, such as may be formed from KMER, or any other suitable photo-resist, will be substantially removed by the HF during the etching operation. Polycrystalline silicon layer 12 is non-reactive to HF and therefore completely masks layer 11 therefrom. When the silicon nitride layer 11 is thick there will be some undercutting such as at 17. Design considerations made prior to the processing can compensate for such undercutting. When a silicon wafer 10 has been chosen as an article for having a silicon nitride coating thereon, the hydrofluoric acid will not in any way alter the silicon surface 18 thereof thereby preserving all semiconductor characteristics of wafer 10.

In the above-described steps 1–6 other materials or articles may be substituted for the semiconductor body of step 1. Further, in step 2 chromium, a thin layer of silicon dioxide or other layers difficult to selectively etch may be substituted for the silicon nitride layer and the described etching operation be successfully performed as described.

After suitable washing the article is then subjected to further processing according to step 7 which may include gallium or indium diffusions. In gallium and indium diffusions the silicon nitride makes a good mask, providing a selectively diffused region 19 in wafer 10. During such diffusions the article being in an oxygen atmosphere and at a raised temperature, silicon layer 12 is connected to a silicon dioxide, and the gallium and induim impurities may react with layer 12. Since silicon nitride layer 11 is intermediate between the body 10 and layer 12, such incidental doping and conversion to silicon dioxide without further electrical connections has insignificant effects on the electrical characteristics of the device being fabricated. It is also known that the oxygen atmosphere of a gallium and indium diffusion attacks and softens silicon nitride. This action has a tendency to eat away or erode the layer 11 as at 17A (FIGS. 2–7). This action is sufficiently slow and the layer 11 is sufficiently thin that no adverse affects on device characteristics have been noted.

Figures 2, 3:
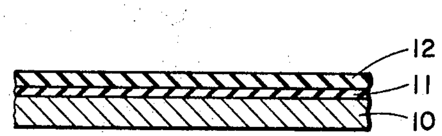
Figures 2, 3, 4:
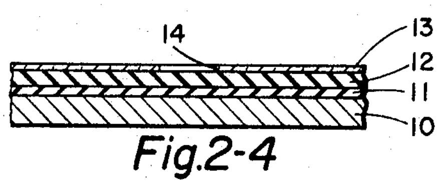
Figures 2, 3, 4, 5:
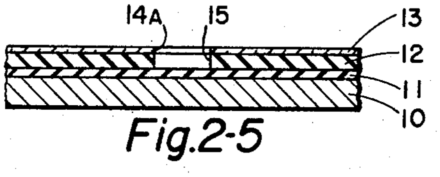
Figures 2, 3, 4, 5, 6:
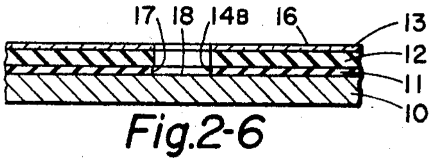
Figures 2, 3, 4, 5, 6, 7:
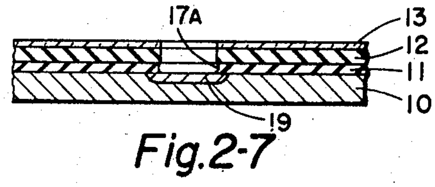
Figure 3:
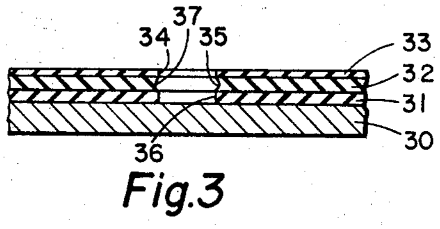

In FIG. 3 there is shown a cross-sectional view of a germanium wafer 30 having a silicon dioxide passivation layer 31 under a silicon nitride layer 32. Such layers may be formed as above described with the silicon dioxide being first deposited in any known manner. The polycrystalline silicon layer 33 is formed on silicon nitride layer 32 as above described in step 3 (FIG. 1). Aperture 34 in layer 33 is formed as in step 5 and aperture 35 in layer 32 is formed as in step 6 with aperture 36 in layer 31 being formed at the same time as aperture 35; that is, hydrofluoric acid etchants attack silicon dioxide (at a slower rate) as well as the silicon nitride. In the example of FIG. 3, silicon dioxide is used as a passivation layer for the germanium wafer and may have a thickness of about 1,000 Angstrom units for example. It should be noted that in subsequent step 7, the gallium or indium diffusion into the germanium, the oxygen atmosphere will attack the silicon nitride layer 32 eating it away laterally as indicated by the curved surfaces 37; however, it attacks silicon dioxide at a slower rate reducing the lateral etching, thereby keeping the exposed area of wafer 30 to a more closely controlled dimension. Such silicon dioxide layer permits more accurate region dimensions to be formed in the germanium or silicon wafer.

Since HF does not attack silicon, layer 32 may be omitted and layer 33 be formed directly on silicon dioxide layer 31 and in the process illustrated in FIG. 1 the thin layer of silicon dioxide may be substituted for silicon nitride.

It should be noted that if the poly-silicon layers 12 of FIG. 2 and 33 of FIG. 3 are exposed to oxygen it may be converted to silicon dioxide which is attacked by the hydrofluoric acid etchants. Therefore, in practicing this invention after the silicon layer is formed it should not be exposed to oxygen atmosphere until after step 6 of the FIG. 1 illustrated process.

I claim:

1. The method of fabricating a semiconductor device comprising the steps of forming a first layer of a material taken from the group consisting of $Si_3N_4$, $SiO_2$ and Cr on a semiconductor body, forming a thin layer of silicon on said first layer, selectively removing portions of said silicon layer to expose portions of said first layer, and applying hydrofluoric acid to etch said exposed portions of said first layer whereby said remaining silicon layer serves as a mask to protect said first layer from hydrofluoric acid.

2. The method of claim 1 wherein said silicon layer has a thickness of an order of magnitude of 200 Angstrom units.

3. The method of claim 1 wherein said coating is formed in a non-oxidizing atmosphere and subsequent to said hydrofluoric acid etch the article is subject to a diffusion having an impurity selected from the class of gallium and indium in an oxygen atmosphere with the silicon coating still covering said nitride layer.

4. The method of claim 3 wherein said silicon coating is formed by subjecting said article to a silane gas in a non-oxidizing atmosphere when the article is at an elevated temperature greater than 400° C. but less than the fusion temperature of any portion of said body.

5. A method as described in claim 1 whereby said first layer is silicon nitride.

References Cited

UNITED STATES PATENTS

| | | | |
|---|---|---|---|
| 2,583,681 | 1/1952 | Brittain et al. | 156—17 XR |
| 3,193,418 | 7/1965 | Cooper et al. | 148—179 |
| 3,438,873 | 4/1969 | Schmidt | 204—35 |

OTHER REFERENCES

Heslop, R. B. and Robinson, P. L., Inorganic Chemistry, 3rd ed. 1967, Elsevier Publishing Co., N.Y., p. 367.

J. H. STEINBERG, Primary Examiner

U.S. Cl. X.R.

156—17; 117—217, 229; 29—587; 96—36.2